United States Patent [19]

Nakaizumi et al.

[11] Patent Number: 4,616,346
[45] Date of Patent: Oct. 7, 1986

[54] RANDOM ACCESS MEMORY CAPABLE OF VARYING A FREQUENCY IN ACTIVE AND STANDBY MODES

[75] Inventors: Kazuo Nakaizumi; Yasaburo Inagaki, both of Tokyo, Japan

[73] Assignee: NEC Corporation, Tokyo, Japan

[21] Appl. No.: 585,656

[22] Filed: Mar. 2, 1984

[30] Foreign Application Priority Data

Mar. 4, 1983 [JP] Japan .................................. 58-35331

[51] Int. Cl.$^4$ ............................................ G11C 11/40
[52] U.S. Cl. ..................................... 365/229; 365/222
[58] Field of Search ................. 365/222, 226, 227, 229

[56] References Cited

U.S. PATENT DOCUMENTS 4,030,084  6/1977  Fisher et al. ......................... 365/222

Primary Examiner—Joseph A. Popek
Attorney, Agent, or Firm—Sughrue, Mion, Zinn, Macpeak, and Seas

[57] ABSTRACT

In a memory selectively operable in an active and a standby mode, a first oscillation signal of a first frequency is produced by an oscillator (35a or 35b) in the standby mode so as to reduce electric power consumption, instead of a second oscillation signal which is produced in the active mode and which has a second frequency higher than the first frequency. The first and the second oscillation signals are selectively supplied as a substrate voltage to a substrate (20) through a substrate voltage production circuit (36). The oscillator may comprise a first circuit portion (46 to 48) for oscillating the second oscillation signal and a capacitor circuit (51 to 53) connected to the first circuit portion through a second circuit portion (56 to 58) in the standby mode so as to generate the second oscillation signal. Alternatively, the oscillator comprises first and second oscillator sections (61 and 67) for generating the first and the second oscillation signals and a selecting circuit (70) for selecting the first and the second oscillation signals. The second oscillation circuit is kept inactive during generation of the first oscillation signal.

9 Claims, 10 Drawing Figures

4,616,346

RANDOM ACCESS MEMORY CAPABLE OF VARYING A FREQUENCY IN ACTIVE AND STANDBY MODES

BACKGROUND OF THE INVENTION

This invention relates to a semiconductor memory comprising a semiconductor substrate.

As well known in the art, a conventional random access memory which comprises a memory array on a semiconductor substrate is for use in combination with a refresh circuit for refreshing information stored in the memory array because refreshing operation is indispensable for the dynamic random access memory so as to avoid dissipation of the information in the dynamic random access memory. Such refresh operation is carried out under control of a central processing unit (CPU).

As will later be described with reference to a few figures of the accompanying drawing, another conventional dynamic random access memory has been proposed wherein a refresh circuit is arranged on the substrate together with the memory array. With this sturucture, refreshing operation is made to automatically and successively progress without being supplied with any address from an external address counter.

Such automatic refresh operation is hidden from the central processing unit. In other words, another conventional dynamic random access memory apparently looks like a static memory from the central processing unit and is therefore often called a pseudo static random access memory.

At any rate, each of the above-mentioned conventional memories is selectively operable in an active mode and a standby mode during which the memory array is enabled and disabled, respectively. Refreshing operation should be carried out even during the standby mode with electric power consumed.

An electric current is caused to flow through the substrate in each of the conventional memories and results in a variation of a potential on the substrate. As a result, the information stored in the memory array is vulnerable to destruction due to the variation of the substrate potential. In order to protect the information against destruction, each of the conventional memories comprises a substrate voltage circuit for supplying a substrate voltage to the substrate to forcibly drive the potential on the substrate to a predetermined potential. This gives rise to an increase of electric power consumption and makes it difficult to drive the conventional memory by a battery.

SUMMARY OF THE INVENTION

It is an object of this invention to provide a semiconductor memory wherein consumption of electric power can be reduced in a standby mode.

It is a specific object of this invention to provide a semiconductor memory of the type described, wherein a reduction is possible of electric power consumption of a substrate voltage circuit in the standby mode.

It is another specific object of this invention to provide a semiconductor memory of the type described, wherein refresh operation is carried out with a low electric power.

It is a further specific object of this invention to provide a semiconductor memory of the type described, which can be driven by a battery even when refresh operation is carried out with a substrate voltage supplied to a substrate on which the semiconductor memory is formed.

A semiconductor memory to which this invention is applicable is selectively operable in an active and a standby mode. The memory comprises a semiconductor substrate, a memory array on the substrate for storage of information, and substrate voltage supplying means for supplying a substrate voltage to the substrate to make the memory array stably store the information. According to this invention, the substrate voltage supplying means comprises first means for selectively producing a first drive signal only during a first duration defined in the standby mode and a second drive signal for a second duration only in the active mode, second means responsive to the first and the second drive signals for selectively producing a first and a second oscillation signal having a first frequency and a second frequency higher than the first frequency, respectively, and third means for selectively supplying the first and the second oscillation signals to the substrate as the substrate voltage.

DESCRIPTION OF THE PREFERRED EMBODIMENTS

Figure 1:
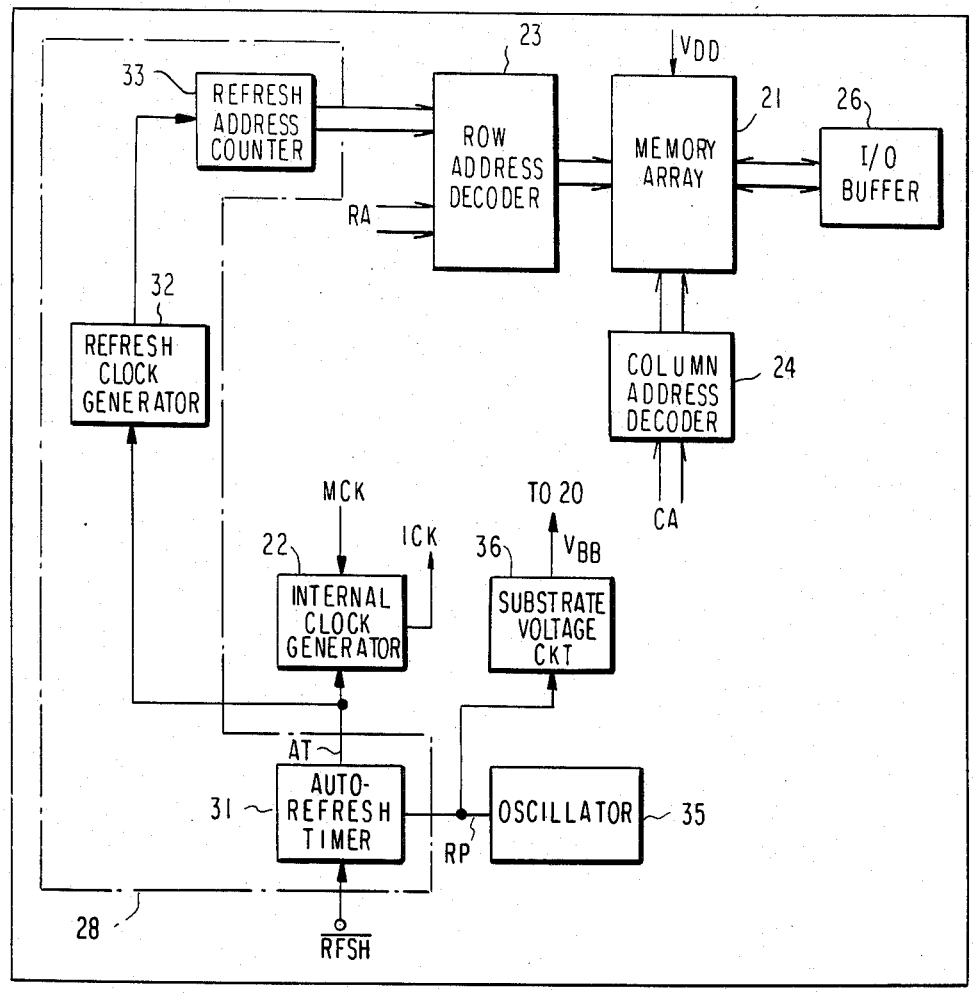
FIG. 1 shows a block diagram of a conventional pseudo static random access memory carrying out auto-refresh operation.

Referring to FIG. 1, a conventional dynamic random access memory will be described for a better understanding of this invention. As described heretobefore, the conventional dynamic random access memory may be called a pseudo static random access memory. The illustrated dynamic random access memory is selectively operable in an active mode and a standby mode, as will later be described. It may be seen that read-out and write-in operation is carried out in the active mode while auto-refresh operation is carried out in the standby mode. The auto-refresh operation is followed by an inactive or quiescent interval of time and is thereafter changed to the active mode. Thus, the inactive interval may be included in a duration of the standby mode.

The illustrated random access memory comprises a semiconductor substrate 20 and a memory array 21 on the substrate 20. The memory array 21 has a predetermined number of dynamic memory cells arranged in rows and columns on the substrate 20. By way of example, the number of the rows is equal to 128. Each dynamic memory cell can store an information signal as an electric charge and should be refreshed at every refresh period of, for example, 2 milliseconds.

In the active mode, an internal clock generator 22 is supplied with a main clock pulse MCK given from a central processing unit (CPU) (not shown) and delivers internal clock pulses ICK to various parts of the random access memory. A row address decoder 23 and a column address decoder 24 are supplied with row and column address signals RA and CA from the central processing unit, respectively. The row and the column address signals RA and CA specify each row address and each column address assigned to the rows and the columns. As a result, read-out or write-in operation is carried out in accordance with the internal clock pulses ICK between an input/output buffer 26 and one address of the memory array 21 that is specified by the row and the column address signals RA and CA. Refresh operation is carried out in the active mode also under control of the central processing unit.

Figure 2:
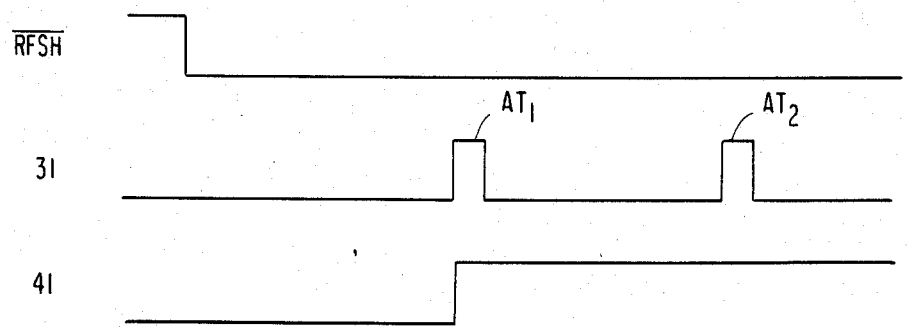
FIG. 2 shows a timing chart for use in describing operation of the conventional memory illustrated in FIG. 1 and a random access memory according to a first embodiment of this invention.

Referring to FIG. 2 in adition to FIG. 1, the illustrated random access memory comprises an internal refresh controller 28 on the substrate 20 together with the memory array 21. The internal refresh controller 28 is operable in response to an enable signal $\overline{RFSH}$ given from the central processing unit. The enable signal $\overline{RFSH}$ is put into a low level during the auto-refresh operation. In other words, the enable signal $\overline{RFSH}$ takes a high level during the active mode and the inactive interval. In this connection, the enable signal $\overline{RFSH}$ of the low level may be called an auto-refresh enable signal so as to render the random access memory into the standby mode.

The internal refresh controller 28 comprises an auto-refresh timer 31 enabled by the auto-refresh enable signal ($\overline{RFSH}$), a refresh clock generator 32 connected to the auto-refresh timer 31 for producing refresh clock pulses, and a refresh address counter 33 for counting the refresh clock pulses to specify a refresh row address to be refreshed.

More particularly, the auto-refresh timer 31 is coupled to an oscillator 35 for producing a sequence of reference pulses RP at a preselected period of, for example, 400 nanoseconds. When enabled by the auto-refresh enable signal ($\overline{RFSH}$), the auto-refresh timer 31 times a frist predetermined duration of, for example, 16 microseconds by counting the reference pulses RP to supply both of the internal clock generator 22 and the refresh clock generator 32 with a first one of auto-refresh timing pulses, as depicted at $AT_1$ in FIG. 2. Responsive to the first auto-refresh timing signal $AT_1$, the internal clock generator 22 is enabled to deliver the internal clocks ICK like in the active mode. The refresh clock generator 32 sends a single one of the refresh clock pulses in response to the first auto-refresh timing signal $AT_1$ to the refresh address counter 33. Practically, each of the refresh clock pulses is delivered to other parts in addition to the refresh address counter 33.

The refresh address counter 33 counts the refresh clock pulses. Responsive to each refresh clock pulse, the refresh address counter 33 supplies the row address decoder 23 with a refresh row address signal representative of a particular on of the row addresses. Inasmuch as the central processing unit does not supply the row address signal RA to the row address decoder 23 in the standby mode, the row address decoder 23 decodes the refresh row address signal to indicate the particular row address. As a result, all of the cells arranged in the particular row address are simultaneously refreshed in the manner known in the art.

When the auto-refresh operation is completed in the cells arranged in the particular row address, the memory array 21 is automatically put into a precharge state, as known in the art. The auto-refresh timer 31 begins to count the reference pulses RP again to time a second predetermined during presence of the autorefresh enable signal ($\overline{RFSH}$). The second predetermined duration defines a timer operation period of the auto-refresh timer 31 and may be equal to 15.625 microseconds when the refresh period and the number of the rows are 2 milliseconds and 128, resectively. The second predetermined duration is therefore determined by the refresh period and the number of the rows and may be shorter than the above-exemplified duration of 15.625 microseconds.

After the second predetermined duration lapses during presence of the auto-refresh enable signal ($\overline{RFSH}$), the auto-refresh timer 31 sends the second one of the auto-refresh timing signal (depicted at $AT_2$ in FIG. 2) to the refresh clock generator 32. Like in the particular row address mentioned above, auto-refresh operartion is carried out in the cells arranged in the following row address. The auto-refresh timer 31 is put into a reset state during the auto-refresh operation.

When the memory array 21 is turned back to the precharge state after the auto-refresh operation, the auto-refresh timer 31 begins to count the reference pulses RP to time the second predetermined duration. Auto-refresh operation is repeated in the manner described before.

The above-mentioned auto-refresh operation is successively and automatically progressive, insofar as the auto-refresh enable signal ($\overline{RFSH}$) is supplied to the auto-refresh timer 31. Otherwise, the auto-refresh operation is interrupted to be changed to the active mode after lapse of the inactive interval. Anyway, operation of the random access memory is changed from the standby mode to the active mode.

In FIG. 1, the illustrated random access memory comprises a substrate voltage production circuit 36 connected to the oscillator 35 and the substrate. More particularly, an electric current flows through the substrate 20 as a substrate current and is variable when the random access memory is put into operation in the active and the standby modes. For example, the substrate current amounts to several tens of microamperes when the random access memory is operated in the active mode at a shortest period of 270 nanoseconds. On the other hand, the substrate current becomes equal to or less than 1 microampere when the random access memory is operated in the standby mode at the timer operation period of 15.625 microseconds. The variation of the substrate current makes a substrate potential inevitably fluctuate during operation of the random access memory. The fluctuation of the substrate potential often destroys the information stored in the memory array 21, as described in the preamble of the instant specification. This is because the information is stored in the memory array 21 in the form of an electric charge and the electric charge is discharged in dependence upon the substrate potential.

It is possible to absorb the substrate current and to keep the substrate 20 at a substantially constant potential, by supplying the substrate 20 with a negative substrate voltage $V_{BB}$, which has a predetermined frequency as will presently become clear. For this purpose, the substrate voltage production circuit 36 gives the substrate voltage $V_{BB}$ to the substrate 20. The substrate voltage $V_{BB}$ should be equal to $-(V_{DD}-1)$ where $V_{DD}$ is a source voltage of the memory array 21. In addition, the substrate voltage production circuit 36 should have a faculty for absorbing a maximum substrate current, such as several tens of microamperes. The frequency of the substrate voltage $V_{BB}$ should be selected so that the maximum substrate current can be absorbed by the substrate voltage production circuit 36. Specifically, the predetermined frequency of the substrate voltage $V_{BB}$ is rendered equal to a frequency of the reference pulses RP supplied from the oscillator 35. At any rate, the substrate voltage production circuit 36 serves to make the memory array 21 stably store the information.

As mentioned above, the frequency of the substrate voltage $V_{BB}$ is selected in consideration of the maximum substrate current. It should be noted here that electric power consumption of the substrate voltage production circuit 36 is determined by the frequency of the reference pulses RP, if a duty ratio of the reference pulses RP is kept constant. More specifically, the electric power consumption increases as the frequency of the reference pulses RP becomes high.

Accordingly, the substrate voltage production circuit 36 excessively consumes electric power in the standby mode. Such excessive consumption of electric power makes it difficult to drive the random access memory by the use of a battery, as pointed out in the premable of the instant specification. A combination of the oscillator 35 and the substrate voltage production circuit 36 may be referred to as a voltage supply circuit for supplying the substrate voltage $V_{BB}$ to the substrate 20.

Figure 3:
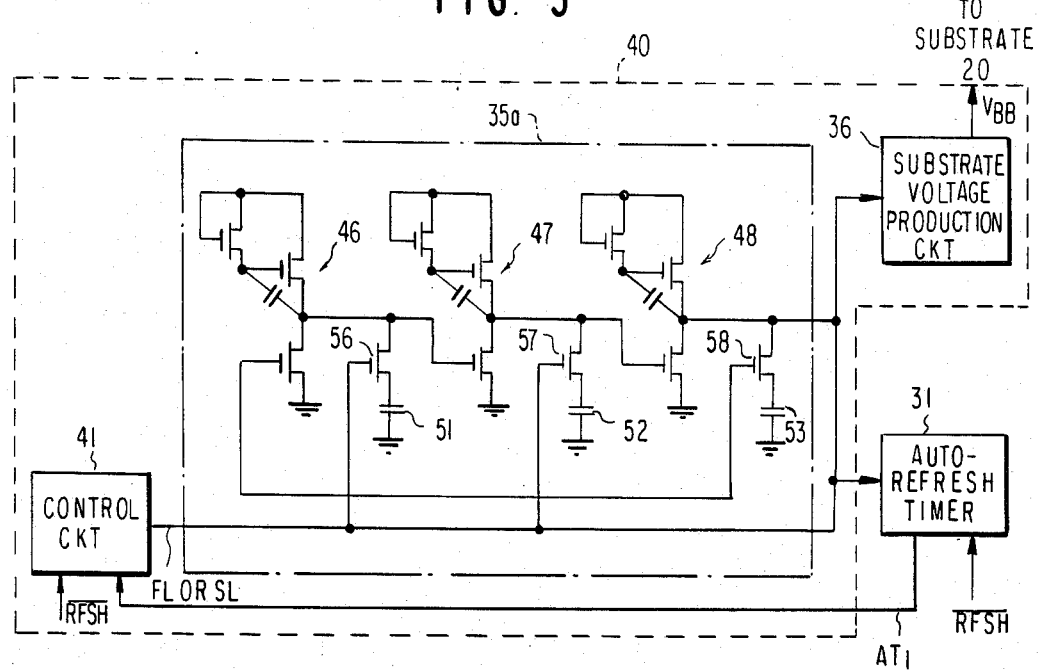
FIG. 3 shows a block diagram of a portion of the random access memory according to the first embodiment.

Referring to FIG. 3, a random access memory according to a first embodiment of this invention is similar to that illustrated in FIG. 1 except that the substrate voltage $V_{BB}$ is produced by the uses of a voltage supply circuit 40 instead of the combination of the oscillator 35 and the substrate voltage production circuit 36 both of which are illustrated in FIG. 1. The remaining parts of the random access memory except both of the voltage supply circuit 40 and the auto-refresh timer 31 are therefore omitted from FIG. 3.

Referring to FIG. 2 again together with FIG. 3, the voltage supply circuit 40 comprises a control circuit 41 supplied with the first auto-refresh timing signal $AT_1$ from the auto-refresh timer 31. As mentioned with reference to FIG. 2, the first auto-refresh timing signal $AT_1$ is produced by the auto-refresh timer 31 when the first predetermined duration of 16 microseconds lapses after reception of the refresh enable signal ($\overline{RFSH}$). Responsive to the first auto-refresh timing signal $AT_1$, the control circuit 41 produces a first level signal FL indicated at a high level in FIG. 2. The first level signal FL lasts during the auto-refresh enable signal ($\overline{RFSH}$) and therefore appears during the standby mode except the first predetermined duration. Auto-refresh operation begins in response to the first auto-refresh timing signal $AT_1$, as mentioned in conjunction with FIGS. 1 and 2. Therefore, the first level signal FL may be calld an auto-refresh indication signal indicating the auto-refresh operation, as will later be described in conjunction with FIG. 4. During the first predetermined duration and the active model, the control circuit 41 produces a second level signal SL indicated at a low level in FIG. 2. The second level signal SL may be referred to as an auto-refresh interruption signal because the auto-refresh operation is interrupted during the second level signal.

As mentioned before, the control circuit 41 selectively produces the first level signal FL only a first time interval determined by both of the auto-refresh enable signal ($\overline{RFSH}$) and the first predetermined duration and the second level signal SL a second time interval comprising the remaining time. The first and the second level signals FL and SL may be called first and second drive signals, respectively.

In FIG. 3, the voltage supply circuit 40 comprises an oscillator depictd at 35a and selectively operable in the first and the second level signals FL and SL. The illustrated oscillator 35a comprises first, second, and third inverter circuits 46, 47, and 48 connected in cascade to one another. Each of the first through the third inverter circuits 46 and 48 comprises driver and load portions comprising a driver MOS transistor (unnumbered) and a pair of load MOS transistors (unnumbered), respectively. An input terminal of each inverter circuit is derived from a gate electrode of each driver MOS transistor while an output terminal is derived from a point of connection between the driver and the load portions of each inverter circuits. A backup capacitor is included in each inverter circuit 46 to 48 to enable high speed operation. The output terminal of the third inverter circuit 48 is linked to the input terminal of the first inverter circuit 46 and connected to a substrate voltage production circuit 36 similar to that illustrated in FIG. 1 and also to the auto-refresh timer 31 illustrated in FIG. 1. The cascade connection of the first through the third inverter circuits 46 to 48 is operable as an oscillation circuit, as known in the art and will be named a first circuit portion.

First, second, and third capacitors 51, 52, and 53 are connected to first, second, and third gate circuits 56, 57, and 58 of MOS transistors which are placed between two adjacent ones of the first through the third inverter circuits 46 to 48 and which are selectively operable in response to the first and the second level signals FL and SL. The first through the third gate circuits 56 to 58 will be referred to as a second circuit portion intermediate between the first circuit portion and the first through the third capacitors 51 to 53. Each of the first through the third gate circuits 56 to 58 is rendered conductive in response to the first level signal FL and kept nonconductive during the second level signal SL.

When the first through the third gate circuits 46 to 48 are rendered conductive in response to the first level signal FL, the first through the third inverter circuits 46 to 48 are connected to the first through the third capacitors 51 to 53 through the first to the third gate circuits 56 to 58, respectively. In this event, let the oscillator 35a generate a first oscillation signal having a first frequency. The first frequency is, for example, 0.64 megahertz.

On the other hand, the first through the third inverter circuits 46 to 48 are disconnected from the first through the third capacitors 51 to 53 when the first through the third gate circuits 56 to 58 are rendered nonconductive. In this event, the oscillator 35a can generate, through the output terminal of the third inverter circuit 48, a second oscillation signal of a second frequency which is higher than the first frequency. This is because a load of the first circuit portion is reduced by disconnection of the first through the third capacitors 51 to 53 from the first through the third inverter circuits 46 to 48. Let the second frequency be 2.5 megahertz or thereabout.

The first and the second oscillation signals are sent to the substrate voltage production circuit 36 to be supplied to the substrate 20 as the substrate voltage $V_{BB}$. As a result, the substrate 20 is supplied with the substrate voltage $V_{BB}$ of the first frequency in the standby mode. Inasmuch as the first frequency is lower than the second frequency, electric power consumption is reduced in the standby mode and, in particular, during the auto-refresh operation.

The first and the second oscillation signals are also sent to the auto-refresh timer 31, as illustrated in FIG. 3. Therefore, the auto-refresh timer 31 is opeated in response to the second oscillation signal until the first auto-refresh timing signal $AT_1$ is produced from the auto-refresh timer 31. The auto-refresh timer 31 is theeafter operated in response to the first oscillation signal during the standby mode.

Figure 4:
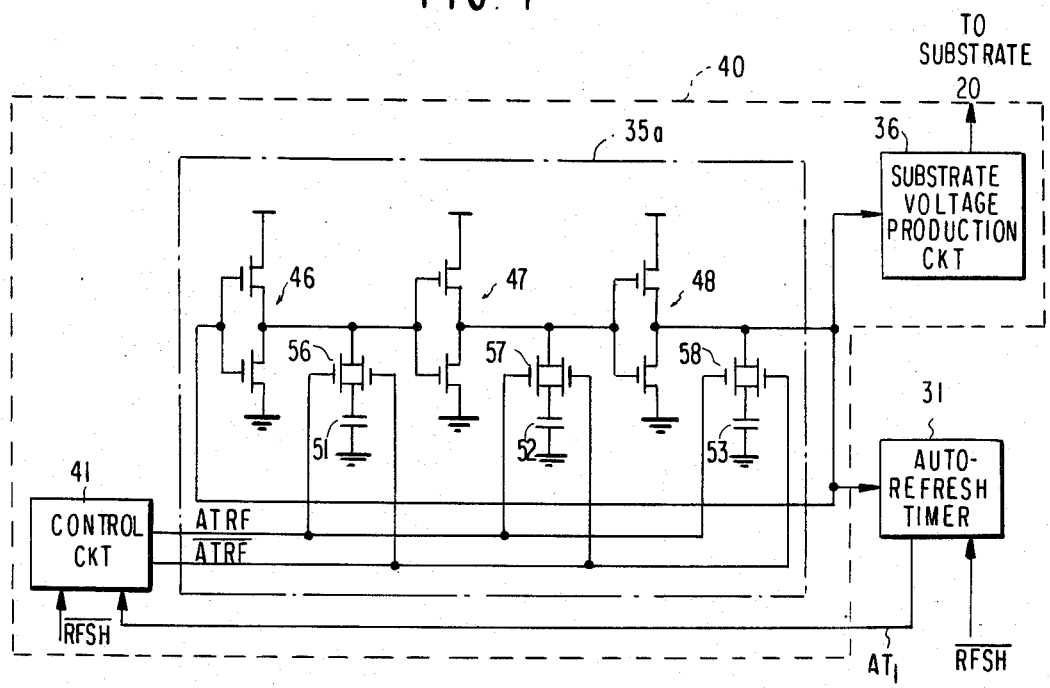
FIG. 4 shows a block diagram of a modification according to the first embodiment of this invention.

Referring to FIG. 4, a random access memory according to a modification of the first embodiment illustrated in FIG. 3 is similar to that illustrated in FIG. 3 except that a complementary-symmetry MOS (CMOS) transistor element is used as each of the first through the third inverter circuits 46 to 48 and the first through the third gate circuits 56 to 58 which are included in the oscillator 35a and that the control circuit 41 delivers an auto-refresh indication signal depicted at ATRF and an ivnverted auto-refresh indication signal $\overline{ATRF}$ to the first through the third gate circuits 56 to 58. The auto-refresh indication signal ATRF is similar to that described in conjunction with FIG. 3. As is well known in the art, each CMOS transistor element consists of an n-channel MOS transistor and a p-channel MOS transistor. The n-channel and the p-channel MOS transistors of each of the first through the third gate circuits 46 to 48 are simultaneously rendered either conductive or nonconductive. More specifically, each of the first through the third inverter circuits 46 to 48 is connected to each of the first through the third capacitors 51 to 53 only when the auto-refresh indication signal ATRF and the inverted auto-refresh indication signal $\overline{ATRF}$ take the high and the low levels, respectively. On the other hand, each of the first through the third inverter circuits 46 to 48 is disconnected from each of the first through the third capacitors 51 to 53 while the auto-refresh indication signal ATRF and the inverted auto-refresh indication signal $\overline{ATRF}$ take the low and the high levels, respectively. From the above, it is readily understood that the illustrated oscillator 35a can be put into operation in the manner described with reference to FIG. 3. The auto-refresh indication signal ATRF and the inverted auto-refresh indication signal $\overline{ATRF}$ may be referred to as first and second drive signals, respectively.

Figure 5:
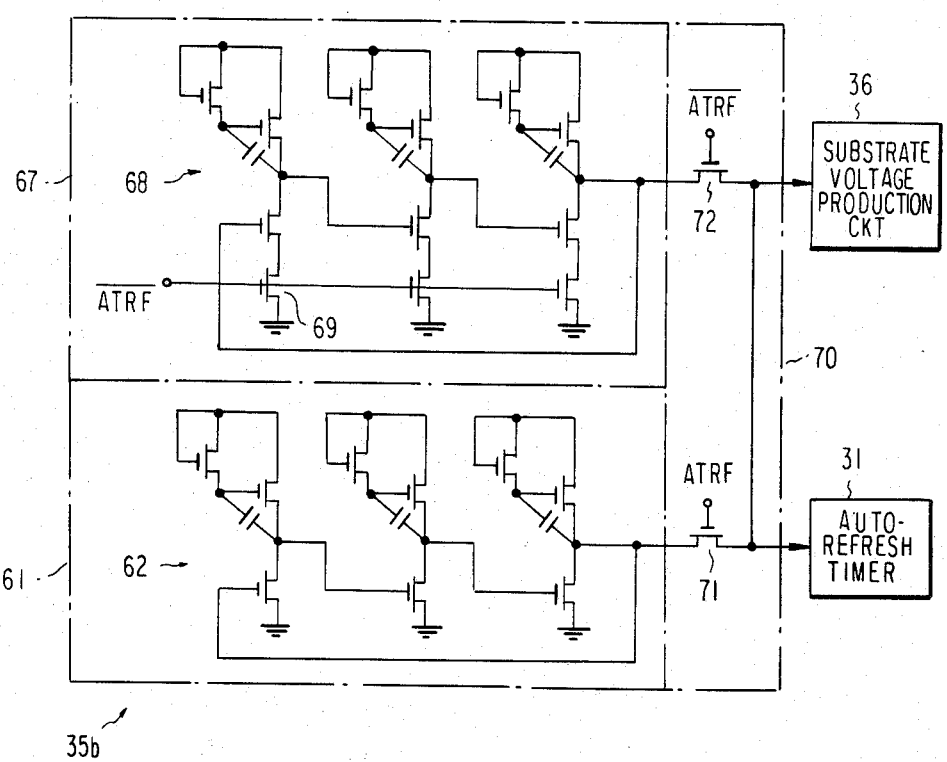
FIG. 5 shows a block diagram of a random access memory according to a second embodiment of this invention.

Referring to FIG. 5, a random access memory according to a second embodiment of this invention comprises an oscillator 35b operable in response to the auto-refresh indication signal ATRF and the inverted auto-referesh indication signal $\overline{ATRF}$, as is the case with FIG. 4. The illustrated oscillator 35b comprises a first oscillator section 61 for oscillating the first oscillation signal of the first frequency. The first oscillator section 61 comprises an inverter 62 having three stages connected in a manner described in conjunction with the first through the third inverter circuits 46 to 48 illustrated in FIG. 3.

The oscillator 35b comprises a second oscillator section 67 for generating the second oscillation signal of the second frequency. As described above, the second frequency is higher than the first frequency. The second oscillator section 67 comprises an additiional inverter 68 of three stages connected in a manner similar to the inverter 62. Each stage of the additional inverter 68 is connected in series to an additional MOS transistor (collectively indicated at 69) supplied with the inverted auto-refresh indication signal $\overline{ATRF}$. With this structure, no second oscillation signal is produced while each additional transistor 69 is kept nonconductive in response to the inverted auto-refresh indication signal $\overline{ATRF}$ of the low level. No electric power is consumed when the auto-refresh indication signal ATRF takes the high level.

In FIG. 5, the first and the second oscillator sections 61 and 67 are coupled to a selecting circuit 70 comprising first and second switches 71 and 72 responsive to the auto-refresh indication signal ATRF and the inverted auto-refresh indication signal $\overline{ATRF}$, respectively. When the auto-refresh indication signal ATRF takes the high level, the first switch 71 is opened with the second switch 72 closed. As a result, the first oscillation signal is delivered through the first switch 71 to the substrate voltage production circuit 36 and the auto-refresh timer 31. In this event, the second oscillator section 67 is quiescent. On the other hand, when the inverted auto-refresh indication signal $\overline{ATRF}$ takes the high level, the second oscillation signal is sent through the second switch 72 to the substrate voltage production circuit 36 and the auto-refresh timer 31.

Thus, the first and the second oscillation signals are selected by the selecting circuit 70 in response to the auto-refresh indication signal ATRF and the inverted auto-refresh indication signal $\overline{ATRF}$, namely, the first and the second drive signals, respectively.

Figure 6:
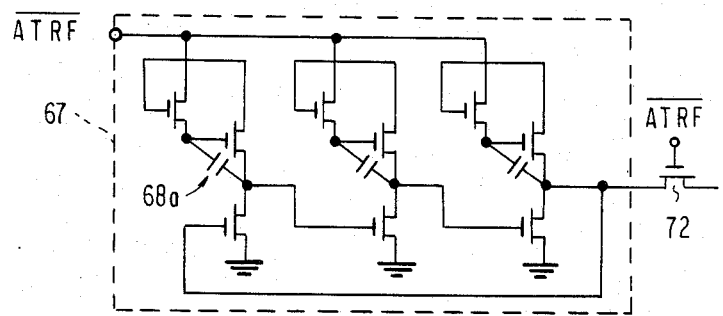
FIG. 6 shows a circuit diagram of a circuit used as a portion of the random access memory illustrated in FIG. 5.

Referring to FIG. 6, a second oscillator section 67 is for use in combination with the oscillator 35b illustrated in FIG. 5 and comprises an additional inverter 68a of three stages similar to that illustrated in FIG. 5. In FIG. 6, each stage of the additional inverter 68a comprises a single driver transistor (unnumbered) and a pair of load transistors (unnumbered), like in FIG. 5. As readily understood from FIG. 6, the second oscillator section 67 does not have the additional MOS transistors 69 illustrated in FIG. 5 and responsive to the inverted auto-refresh indication signal $\overline{ATRF}$. Instead, the inverted auto-refresh indication signal $\overline{ATRF}$ is supplied to one of the load transistors of each stage. With this structure, it is possible to keep the second oscillator section 35b inactive while the inverted auto-refresh indication signal $\overline{ATRF}$ takes the low level, like in FIG. 5. Electric power consumption is therefore reduced in the illustrated second oscillator section 67.

Figure 7:
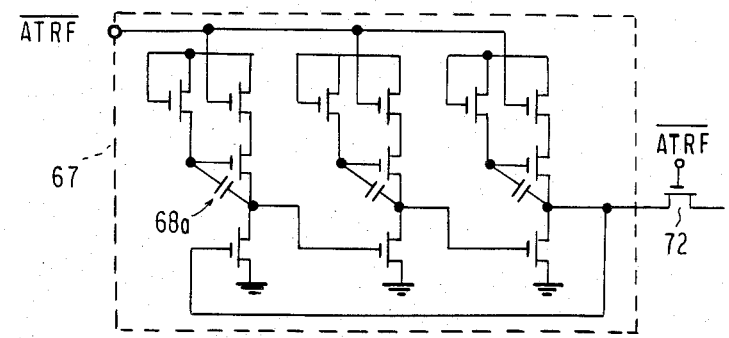
FIG. 7 shows a circuit diagram of another circuit used as the portion of the random access memory illustrated in FIG. 5.

Referring to FIG. 7, another second oscillator section 67 can be substituted for that illustrated in FIG. 5. The second oscillator section 67 comprises an additional inverter 68b of three stages connected in the manner described in FIG. 5. Each stage comprises a single drive transistor (unnumbered) and three load transistors (unnumbered). One of three load transistors of each stage is supplied with the inverted auto-refresh indication signal $\overline{ATRF}$. The illustrated second oscillator section 67 is rendered into a quiescent state to produce no second oscillation signal while the inverted auto-refresh indication signal $\overline{ATRF}$ takes the low level.

Figure 8:
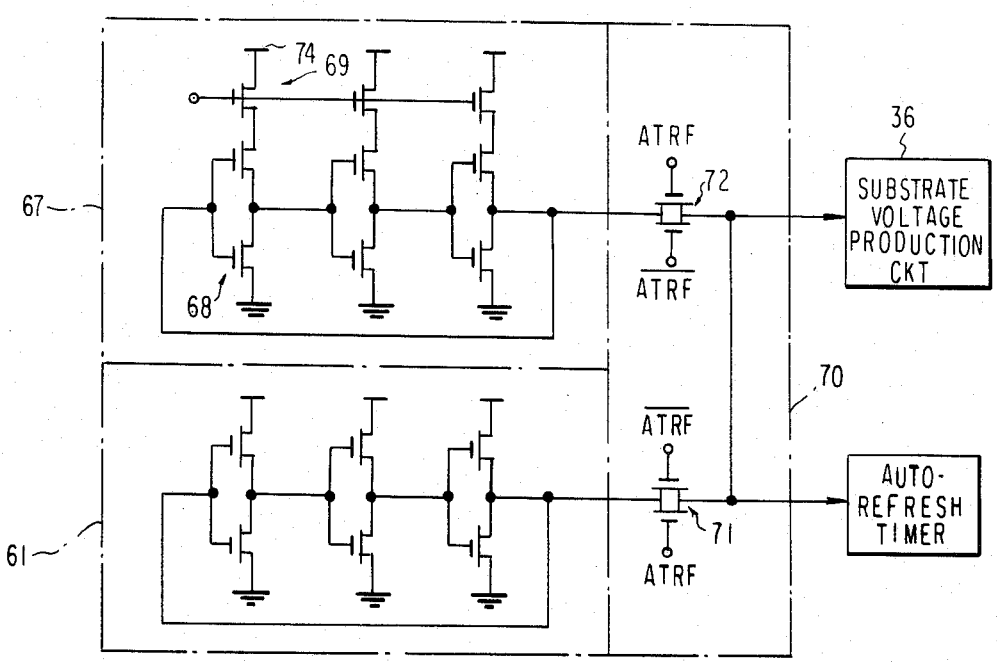
FIG. 8 shows a block diagram of a random access memory according to a modification of the second embodiment illustrated in FIG. 5.

Referring to FIG. 8, a random access memory according to a modification of the second embodiment illustrated in FIG. 5 is similar to that illustrated in FIG. 5 except that a CMOS transistor element is used as each stage of an inverter 62 and an additional inverter 68 and as each of first and secon switches 71 and 72 and that an additional MOS transistor (collectively indicated at 69) is connected between each stage of the additional inverter 68 and a source terminal (collectively shown at 74) and is supplied with the auto-refresh indication signal ATRF. The second oscillator section 67 becomes inactive in response to the low level of the auto-refresh indication signal ATRF, like in FIG. 5. The first and the second switches 71 and 72 are alternatingly turned on and off, as are the cases with those illustrated in FIG. 5. To this end, the CMOS transistor element of the first switch 71 is selectively kept conductive and nonconductive when the CMOS transistor of the second switch 72 is put into nonconductive and conductive states, respectively.

Figure 9:
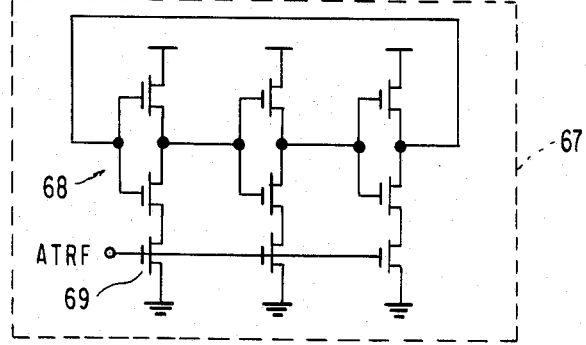
FIG. 9 shows a circuit diagram of a circuit substituted for a portion of the random access memory illustrated in FIG. 8.

Referring to FIG. 9, a second oscillator section 67 can be substituted for that illustrated in FIG. 8 and comprises an additional inverter 68 of three stages and additional MOS transistors (collectively shown at 69) responsive to the ivnerted auto-refresh indication signal $\overline{ATRF}$, instead of the auto-refresh indication signal ATRF. Each additional MOS transistor 69 is therefore connected in series between ach stage of the additional inverter 68 and a ground terminal, as illustrated in FIG. 9.

With this structure, no electric power is consumed when each additional MOS transistor 69 is kept nonconductive by supply of the low level of the inverted auto-refresh indication signal $\overline{ATRF}$.

Figure 10:
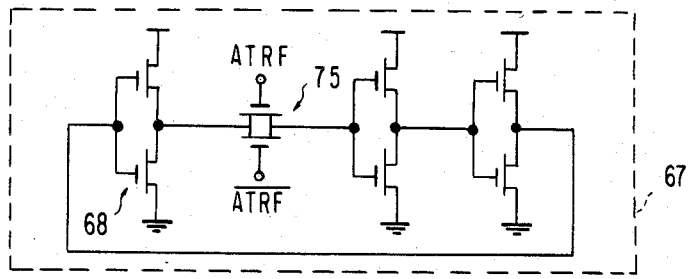
FIG. 10 shows a circuit diagram of another circuit substituted for the portion of the random access memory illustrated in FIG. 8.

Finally referring to FIG. 10, another second oscillator section 67 can also be substituted for that illustrated in FIG. 8 and comprises only an additional inverter 68 without any additional MOS transistors 69 illustrated in FIG. 9. Instead, an additional switch 75 is arranged between first and second stages of the additional inverter 68 and comprises a CMOS transistor element responsive to the auto-refresh indication signal ATRF and the inverted auto-refresh indication signal $\overline{ATRF}$. Inasmuch as the additional switch 75 is turned on only when the auto-refresh indication signal ATRF and the inverted auto-refresh indication signal $\overline{ATRF}$ take the low and the high levels, respectively, the illustrated second oscillator section 75 generates the second oscillation signal only when no auto-refresh operation is carried out.

While this invention has thus far been described in conjunction with a few embodiments thereof, it will readily be possible for those skilled in the art to put this invention into practice in various manners. For example, this invention is equally well applicable not only to a usual dynamic random access memory comprising no internal refresh controller 28 on the substrate 20 but also to a static random access memory, if each memory has a substrate voltage production circuit as shwon at 36. The first drive signal, namely, the auto-refresh indication signal ATRF may be produced simultaneously with the auto-refresh enable signal ($\overline{RFSH}$) without waiting for production of the first auto-refresh timing signal $AT_1$ illustrated in FIG. 2.

What is claimed is:

1. In a semiconductor memory selectively operable in an active and a standby mode, said memory comprising a semiconductor substrate, a memory array on said substrate for storage of information, and substrate voltage supplying means for supplying a substrate voltage to said substrate, the improvement wherein said substrate voltage supplying means comprises:
   first means for selectively producing a first drive signal only during a first duration defined in said standby mode and a second drive signal only in said active mode and the period of said standby mode that excludes said first duration;
   second means responsive to said first and said second drive signals for selectively producing a first and said second drive signals for selectively producing a first and a second oscillation signal having a first frequency and a second frequency higher than said first frequency, respectively; and
   third means for selectively supplying said first and said second oscillation signals to said substrate as said subtrate voltage.

2. A semiconductor memory as claimed in claim 1, further comprising:
   refreshing means coupled to said second means for successively and automatically refreshing information stored in said memory array during said first duration at a first refresh period determined by said first frequency.

3. A semiconductor memory as claimed in claim 2, wherein said refreshing means is arranged on said substrate together with said memory array and said second means.

4. A semiconductor memory as claimed in claim 1, wherein said second means comprises:
   a capacitor circuit;
   a first circuit portion for generating said second oscillation signal at siid second frequency when disconnected from said capacitor circuit; and
   a second circuit portion intermediate between said first circuit portion and said capacitor circuit for electrically connecting said first circuit portion to said capacitor circuit when supplied with said first drive signal and, otherwise, for electrically disconnecting said capacitor circuit from said first circuit portion to produce said second oscillation signal, said first and said second circuit portions and said capacitor circuit generating said first oscillation signal when connected altogether.

5. A semiconductor memory as claimed in claim 1, wherein said second means comprises:
   a first oscillator for oscillating said first oscillation signl at said first frequency;
   a second oscillator for oscillating said second oscillation signal at said second frequency; and
   a selecting circuit coupled to said first and said second oscillators for selecting said first and said second oscillation signals in response to said first and said second drive signals, respectively.

6. A semiconductor memory selectively operable in active and a standby mode, comprising a semiconductor substrate, a memory array formed on said substrate for storing information, a variable frequency generator for generating an oscillation signal of a first frequency in said standby mode and of a second frequency higher than said first frequency in said active mode, respectively, and a substrate voltage production circuit responsive to said oscillation signal for generating a substrate voltage for biasing said substrate to cause a current to flow through said substrate, said current being reduced in said standby mode in response to said oscillation signal of said first frequency.

7. A semiconductor memory as claimed in claim 6, further comprising a refresh circuit for automatically refreshing contents of memory cells of said memory array in said standby mode at a cycle rate defined by said first frequency.

8. A semiconductor memory as claimed in claim 6, wherein said variable frequency generator includes a first oscillator adapted to generate the oscillation signal of said first frequency in said standby mode, a second oscillator adapted to generate the oscillation signal of said second frequency in said active mode, and a selection circuit coupled to said first and second oscillators for deriving the output of said first oscillator in said active mode and the output of said second oscillator in said active mode, respectively.

9. A semiconductor memory as claimed in claim 6, wherein said variable frequency generator includes a plurality of inverters which are connected in cascade to one another and each of which has an inverter input terminal, a capacitor, a switch circuit for selectively coupling one end of said capacitor to one of said inverter terminals, and control means for enabling said switch circuit in said standby mode and disabling said switch circuit in said active mode.

* * * * *

UNITED STATES PATENT AND TRADEMARK OFFICE
CERTIFICATE OF CORRECTION

PATENT NO. : 4,616,346

DATED : October 7, 1986

INVENTOR(S) : Nakaizumi et al

It is certified that error appears in the above-identified patent and that said Letters Patent is hereby corrected as shown below:

Column 4, line 5, Delete "on" and insert --one--

Column 4, line 18, After "predetermined" insert --duration--

Column 4, line 18, Between "auto" and "refresh" insert -- - --

Column 5, line 44, Delete "-" between "substrate" and "20"

Column 7, line 26, Delete "theeafter" and insert --thereafter--

Column 9, line 34, Delete "ach" and insert --each--

Column 10, line 40, Delete "siid" and insert --said--

Column 7, line 22, Delete "opeated" and insert --operated--

Signed and Sealed this

Thirty-first Day of March, 1987

Attest:

DONALD J. QUIGG

*Attesting Officer*   *Commissioner of Patents and Trademarks*